(12) United States Patent
Farrar et al.

(10) Patent No.: US 7,492,042 B2
(45) Date of Patent: Feb. 17, 2009

(54) INTEGRATED CIRCUIT COOLING AND INSULATING DEVICE AND METHOD

(75) Inventors: Paul A. Farrar, Bluffton, SC (US); Leonard Forbes, Corvallis, OR (US); Kie Y. Ahn, Chappaqua, NY (US); Joseph E. Geusic, Berkeley Heights, NJ (US); Arup Bhattacharyya, Essex Junction, VT (US); Alan R. Reinberg, Cheshire, CT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/977,515

(22) Filed: Oct. 25, 2007

(65) Prior Publication Data

US 2008/0048314 A1 Feb. 28, 2008

Related U.S. Application Data

(62) Division of application No. 10/930,252, filed on Aug. 31, 2004, now Pat. No. 7,300,821.

(51) Int. Cl.
*H01L 23/34* (2006.01)

(52) U.S. Cl. .............. 257/721; 257/713; 257/E23.097; 257/E23.099

(58) Field of Classification Search .............. 257/721
See application file for complete search history.

(56) References Cited

U.S. PATENT DOCUMENTS

| | | |
|---|---|---|
| 1,254,987 A | 1/1918 | Cooper |
| 1,976,375 A | 10/1934 | Smith |
| 2,244,608 A | 6/1941 | Cooper |
| 3,147,110 A | 9/1964 | Foerster |
| 3,337,334 A | 8/1967 | Fenn et al. |
| 3,506,438 A | 4/1970 | Krock et al. |
| 3,548,915 A | 12/1970 | Richmond et al. |
| 3,548,948 A | 12/1970 | Richmond et al. |
| 3,687,737 A | 8/1972 | Krock et al. |
| 4,389,429 A | 6/1983 | Soclof |
| 4,561,173 A | 12/1985 | Te Velde |
| 4,577,212 A | 3/1986 | Hueckel et al. |
| 4,673,589 A | 6/1987 | Standley |
| 4,705,659 A | 11/1987 | Bernstein et al. |

(Continued)

OTHER PUBLICATIONS

"'Green' Chiller Technology Rolled Out For Earth Day", *Penn State News Release*, http://www.sciencedaily.com/releases/2004/04/040421232304.htm,(Apr. 22, 2004).

(Continued)

*Primary Examiner*—David A Zarneke
(74) *Attorney, Agent, or Firm*—Schwegman, Lundberg & Woessner, P.A.

(57) ABSTRACT

A method and device for cooling an integrated circuit is provided. A method and device using a gas to cool circuit structures such as a number of air bridge structures is provided. A method and device using a boiling liquid to cool circuit structures is provided. Further provided is a method of controlling chip temperature. This allows circuit and device designers an opportunity to design more efficient structures. Some properties that exhibit less variation when temperature ranges are controlled include electromigration, conductivity, operating speed, and reliability.

19 Claims, 5 Drawing Sheets

U.S. PATENT DOCUMENTS

| | | | |
|---|---|---|---|
| 4,734,820 A | 3/1988 | Lauffer et al. |
| 4,770,897 A | 9/1988 | Wu |
| 4,912,548 A | 3/1990 | Shanker et al. |
| 4,962,058 A | 10/1990 | Cronin et al. |
| 4,980,754 A | 12/1990 | Kotani et al. |
| 5,084,750 A | 1/1992 | Adlerstein |
| 5,191,404 A | 3/1993 | Wu et al. |
| 5,303,555 A | 4/1994 | Chrysler et al. |
| 5,311,465 A | 5/1994 | Mori et al. |
| 5,324,683 A | 6/1994 | Fitch et al. |
| 5,324,684 A | 6/1994 | Kermani et al. |
| 5,336,914 A | 8/1994 | Andoh |
| 5,408,742 A | 4/1995 | Zaidel et al. |
| 5,444,105 A | 8/1995 | Ornstein |
| 5,457,334 A | 10/1995 | Nishimoto |
| 5,510,645 A | 4/1996 | Fitch et al. |
| 5,578,146 A | 11/1996 | Grant et al. |
| 5,593,926 A | 1/1997 | Fujihira |
| 5,673,561 A | 10/1997 | Moss |
| 5,701,666 A | 12/1997 | DeHaven et al. |
| 5,725,689 A | 3/1998 | Nishida et al. |
| 5,780,928 A | 7/1998 | Rostoker et al. |
| 5,784,328 A | 7/1998 | Irrinki et al. |
| 5,891,797 A | 4/1999 | Farrar |
| 5,994,777 A | 11/1999 | Farrar |
| 6,392,306 B1 | 5/2002 | Khandros et al. |
| 6,413,827 B2 | 7/2002 | Farrar |
| 6,433,413 B1 | 8/2002 | Farrar |
| 6,574,968 B1 | 6/2003 | Symko et al. |
| 6,614,092 B2 | 9/2003 | Eldridge et al. |
| 6,670,714 B1 | 12/2003 | Miyamoto et al. |
| 6,670,719 B2 | 12/2003 | Eldridge et al. |
| 6,674,167 B1 | 1/2004 | Ahn et al. |
| 6,679,315 B2 | 1/2004 | Cosley et al. |
| 6,686,654 B2 | 2/2004 | Farrar et al. |
| 6,709,968 B1 | 3/2004 | Eldridge et al. |
| 6,725,670 B2 | 4/2004 | Smith et al. |
| 6,744,136 B2 | 6/2004 | Dubhashi |
| 6,747,347 B2 | 6/2004 | Farrar et al. |
| 6,808,015 B2 | 10/2004 | Osakabe |
| 6,861,287 B2 | 3/2005 | Farrar et al. |
| 6,992,888 B1 | 1/2006 | Iyer |
| 6,994,151 B2 | 2/2006 | Zhou et al. |
| 7,035,104 B2 | 4/2006 | Meyer |
| 7,095,111 B2 | 8/2006 | Hu et al. |
| 7,112,542 B2 | 9/2006 | Juengling et al. |
| 7,202,562 B2 | 4/2007 | Farrar |
| 7,215,547 B2 | 5/2007 | Chang et al. |
| 2004/0000150 A1 | 1/2004 | Symko et al. |
| 2005/0285220 A1 | 12/2005 | Farrar |
| 2006/0046322 A1 | 3/2006 | Farrar et al. |
| 2006/0238187 A1 | 10/2006 | Farrar |
| 2006/0244112 A1 | 11/2006 | Farrar |
| 2006/0249837 A1 | 11/2006 | Farrar et al. |
| 2007/0023894 A1 | 2/2007 | Farrar |
| 2007/0042595 A1 | 2/2007 | Farrar |

OTHER PUBLICATIONS

Application Serial No. 10-930252 Non final office action mailed Feb. 23, 2007, 10 pgs.

Application Serial No. 10-930252 Notice of allowance mailed Jul. 11, 2007, 10 pgs.

Application Serial No. 10-930252 Response filed May 23, 2007 to Non final office action mailed Feb. 23, 2007, 8 pgs.

"Fundamentals of Sonic Cleaning", http://www.icknowledge.com/misc_technology/Megasonic.pdf, (Archived Apr. 20, 2003), 1 page.

"Megasonics—Sage Solvent Alternatives Guide", http://clean.rti.org/alt.cfm?id=me&cat=ov, Research Triangle Institute,(Mar. 15, 1995).

"What is megasonics cleaning?", http://www.prosysmeg.com/technology/articles/megasonics_cleaning.php, ProSys, Inc.,(Copyright 1997-2004).

Ballister, Stephen C., et al., "Shipboard Electronics Thermoacoustic Cooler", Report No. A415003, Naval Postgraduate School, Monterey, CA, Abstract,(Jun. 1995).

Bhusari, Dhananjay, "Fabrication of Air-Channel Structures for Microfluidic, Microelecromechanical, and Microelectonic Applications", *Journal of Microelectromechanical Systems*, 10 (3), (Sep. 2001),400-408.

Blodgett, A J., et al., "Thermal Conduction Module: A High-Performance Multilayer Ceramic Package", *IBM Journal of Research and Development*, 26(1), (1982),30-36.

Singer, Peter, "The New Low-K Candidate: It's a Gas", *Semiconductor International*, 22(3), (Mar. 1999),38.

Vardaman, E. J., "Future Packaging Trends: CSP vs. Flip Chip", *11th European Microelectrics Conference*, Venice, (1997),295-299.

INTEGRATED CIRCUIT COOLING AND INSULATING DEVICE AND METHOD

This application is a divisional of U.S. application Ser. No. 10/930,252 filed Aug. 31, 2004 now U.S. Pat. No. 7,300,821, which is incorporated herein by reference in its entirety.

TECHNICAL FIELD

This invention relates to semiconductor devices and semiconductor device fabrication. Specifically this invention relates to integrated circuit and memory device structures and methods for cooling and operating such devices.

BACKGROUND

As the minimum feature size achievable, in semiconductor manufacturing decreases, the capacitive coupling between adjacent devices becomes a significant impediment to achieving higher performance. Unfortunately there are only a limited number of potential solutions to this problem. As the minimum feature size decreases the number of devices potentially achievable, in a given area, increases with the inverse square of the feature size while the space between devices decreases linearly. As the density of devices is raised, the amount of interconnection metallurgy must also be raised, which has the effect of increasing undesirable capacitive interactions between circuits on the chip. Designers and process engineers have been looking for ways to counteract this wiring capacitance problem.

One approach has been to substitute lower dielectric constant materials with air gap insulator configurations between active devices. Such air gaps or air bridges have been employed to a limited degree for certain specialized applications. However, the use of air gap insulation introduces some other design challenges. For example environmental corrosion of exposed air structures are a concern. Additionally, heat must be removed from air bridge structures. Because continuing device size reductions require that the cross sections of the metal conductor lines also be reduced, the electrical resistance per unit length of the conductors is increased along with the generation of heat via resistive heating of the metallurgy. Replacement of the traditional aluminum and aluminum alloy conductors with more conductive copper is now underway but this only partially reduces the heating problem.

Although a specific problem of reducing heat generated by air bridge interconnect structures is described, a more general problem includes the inefficiencies of the current wide range of integrated circuit operating temperatures. Because current devices are designed to operate in large ranges of temperatures (for example −20 to 80 degrees C. is not uncommon) a number of design compromises must be made. Material characteristics such as conductivity, electromigration, etc. change over these wide ranges of temperatures, therefore circuit designers must assume that several extreme temperature conditions are possible, and the circuits must be designed to be very robust over these large temperature ranges.

What is needed is a method and device to provide improved cooling for integrated circuits. What is also needed is a method and device that provides good insulating characteristics to reduce undesirable capacitive interactions in integrated circuits. What is also needed is a method and device to improve design efficiency and operational efficiency in integrated circuits.

DETAILED DESCRIPTION

Figure 1:
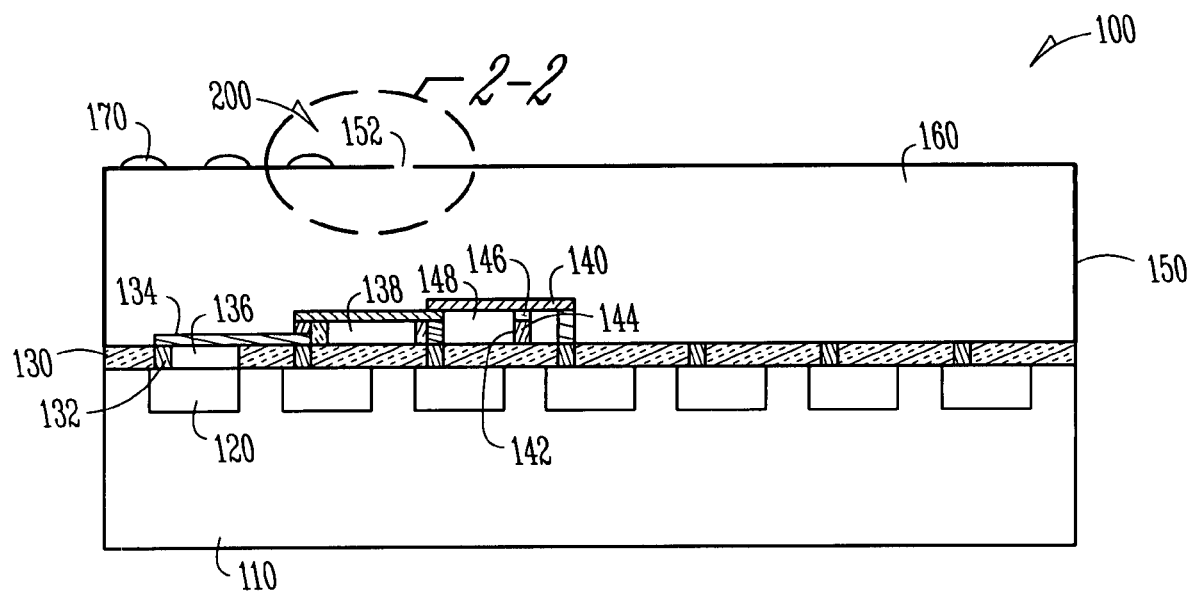
FIG. 1 shows a partially schematic cross section side view of an integrated circuit chip according to an embodiment of the invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form a device or integrated circuit (IC) structure. The term substrate is understood to include semiconductor wafers. The term substrate is also used to refer to semiconductor structures during processing, and may include other layers, such as silicon-on-insulator (SOI), etc. that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors. The term metal is understood to include a element or a alloy of elements wherein the electrical and or thermal conductivity is greater than that of a semiconductor.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

FIG. 1 shows a diagram of an integrated circuit 100. The integrated circuit 100 is shown formed on a substrate 110 such as a silicon wafer. Other substrates 110 include various semiconductors, semiconductor layers, silicon-on-insulator (SOI) structures, etc. A number of electronic devices 120 are shown formed on or within the substrate 110. In one embodiment, the number of electronic devices 120 includes a number of transistors, capacitors, etc. In one embodiment, the number of electronic devices 120 are configured into memory cells in a memory device. In one embodiment the number of electronic devices 120 are configured into a logic circuit such as a processor circuit.

A number of conductor paths are formed to connect the number of electronic devices 120. In one embodiment the conductor paths are formed as metal paths, although other conductor materials can be used. In FIG. 1, the conductor paths include a number of contacts 132 that are shown coupled to the number of electronic devices 120. As discussed above, in one embodiment, the contacts 132 include metal. FIG. 1 shows an insulator layer that the contacts 132 are formed through to make contact with the number of electronic devices 120.

A trace conductor 134 is shown connecting multiple electronic devices 120. In one embodiment, the trace conductor 134 includes a metal trace. Although a number of materials are possible for trace conductors, some examples include aluminum metal traces, and copper metal traces. Aluminum and copper have desirable properties such as low resistance and high thermal conductivity.

In one embodiment, the trace conductor 134 is formed to leave an air gap 136 or air bridge structure. As described above, air gap insulation is desirable due to improved capacitance interactions in the integrated circuit 100, however thermal conduction through air is not as effective as through most solid insulator materials.

A second air gap 138 and a third air gap 148 are further shown in FIG. 1. In one embodiment, a trace conductor 140 is at least partially supported by a support structure 142 over a portion of the length of the air gap 148. In one embodiment, the support structure 142 includes a metal portion 144 and an insulator portion 146. A metal portion 144 is easily constructed during other fabrication processes as layers are built up on the integrated circuit 100, and the insulator portion 146 keeps the trace conductor 140 electrically isolated over its length. In one embodiment, the metal portion 144 further provides a cooling function to the integrated circuit 100 and provides increases surface area to dissipate heat, similar to a cooling fin.

An outer containment structure 150 is shown schematically around a portion of the integrated circuit 100. The containment structure 150 can be fabricated from a number of materials such as metal, insulator material, or combinations of several materials. A number of conductive connecting structures 170 are shown on an outer surface of the containment structure 150. In one embodiment the number of conductive connecting structures 170 include connections similar to controlled collapse chip connect (C4) structures. In one embodiment, at least one opening 152 is included in the containment structure 150. A closer view of an example opening 152 is shown in FIG. 2.

In one embodiment, a cooling media is introduced inside the containment structure 150 that conducts heat away from structures in the integrated circuit 100 while also providing low dielectric constant insulating properties. In one embodiment, the cooling media is in direct contact with heat generating structures such as trace conductors 134 and 140, etc. Direct contact improves heat conduction, and in air bridge embodiments, the increased surface area of direct contact further enhances heat conduction.

In one embodiment, the cooling media includes a gas of one or more components. In one embodiment, the gas includes hydrogen. In one embodiment, the gas includes a mixture of hydrogen and helium. Hydrogen and helium gasses have advantages that include low dielectric constant for good insulation, while also possessing high thermal conductivity. Hydrogen and Helium gasses are also substantially inert to trace conductor materials, thus corrosion problems are reduced or eliminated. Hydrogen includes an advantage of low permeability or diffusivity through metals, glasses, and other packaging materials. Low permeability is advantageous because over time, and at elevated temperatures, as the gas diffuses out through the containment structure 150, the level of insulating and heat conducting properties diminishes. In one embodiment, the gas is under pressure. Among other advantages, pressurizing the gas ensures that while small amounts of gas may diffuse out of the containment structure 150, there will still be a supply of gas remaining for insulating and heat conducting. Pressurizing the gas further provides enhanced thermal conduction properties. For example, pressures of 5-50 MPa yield a thermal conductivity of $1.6\times10^{-3}$ to $1.6\times10^{-2}$ cal-cm/sec ° C. respectively. This compares to a value of $2.3\times10^{-2}$ cal-cm/sec ° C. for fused silica and $5.7\times10^{-5}$ cal-cm/sec ° C. for air at atmospheric pressure.

Figure 2:
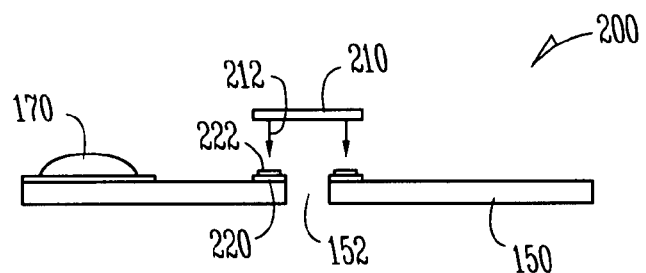
FIG. 2 shows a close up view of a portion of FIG. 1.

FIG. 2 shows an embodiment where a gas cooling media is introduced to the structure containing the integrated circuit 100 through a sealing device 200. In one embodiment, the sealing device 200 includes a metal ring 220 that is deposited around the opening 152 in the containment structure 150. In one embodiment, the metal ring 220 is deposited in the same operation as deposition of C4 pads. A solder ring 222 is then deposited over the metal ring 220. In one embodiment, the solder ring 222 has a higher melting temperature than the connecting structures 170 and lower than that of any internal C4 structures. A lid 210 such as a metal lid is also shown that completes a seal over the opening after the gas is introduced inside the containment structure 150. In one embodiment, the gas is introduced inside a pressurized chamber and allowed time to fill cavities within the containment structure 150. The lid 210 is then sealed over the opening 152 using the solder ring 222, thus sealing in the gas.

In one embodiment, the cooling media includes a liquid material. In one embodiment, the liquid material is chemically inactive or inert with respect to trace conductor materials and other integrated circuit materials. In one embodiment the liquid material is chosen with a boiling temperature that is also a desired operating temperature for the integrated circuit 100. In one embodiment the liquid material includes iso-butyl-flouride also known as (1-F-2-Me-propane) $[(CH_3)_2CHCH_2F]$ which has a boiling point of 16° C. An example operating range of an integrated circuit using iso-butyl-flouride includes a range from 6° C. to 26° C. In one embodiment, the liquid material includes diazo-methane $[CH_2N_2]$ with a boiling point of −23° C. An example operating range of an integrated circuit using diazo-methane includes a range from −33° C. to −13° C. In one embodiment, the liquid material includes propane $[CH_3CH_2CH_3]$ with a boiling point of −42° C. An example operating range of an integrated circuit using propane includes a range from −52° C. to −32° C.

In one embodiment, the liquid material is present in sufficient amounts and with sufficient thermal contact surface area to maintain the temperature of the integrated circuit 100 at approximately the boiling point temperature of the liquid material.

Figure 3:
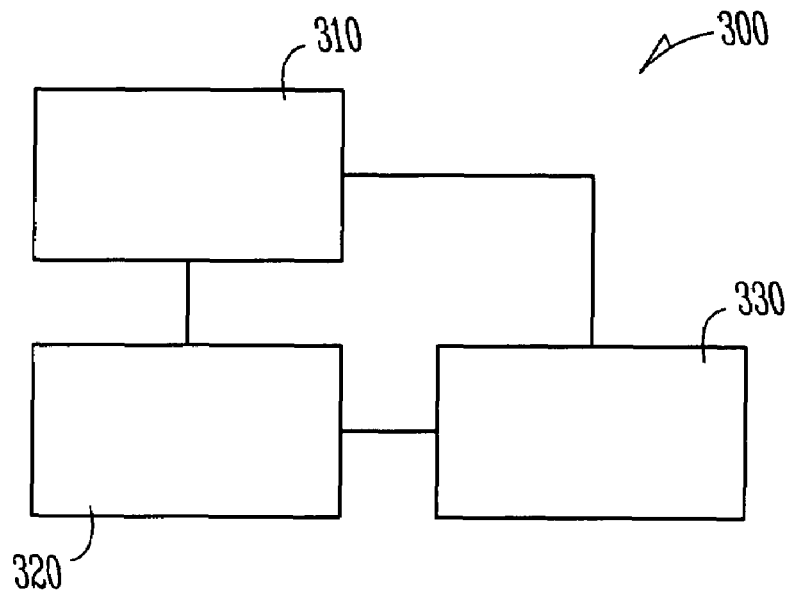
FIG. 3 shows a block diagram of a system according to an embodiment of the invention.

FIG. 3 shows a block diagram of a system 300 for cooling an integrated circuit. The system 300 includes a chip 310. In one embodiment, the chip 310 includes structures such as air bridge structures as described above. In one embodiment, the chip 310 includes cooling media such as a gas or gas mixture as described above. In one embodiment, the cooling media includes a boiling liquid as described above.

A secondary cooling device 320 is coupled to the chip 310. In one embodiment, the secondary cooling device 320 includes a mechanical refrigeration device. In one embodiment, the secondary cooling device 320 includes a Peltier effect device. In one embodiment, a temperature sensing circuit 330 is further included in the system 300 to control the secondary cooling device 320. In one embodiment, a temperature of the chip 310 is controlled to within a range of temperature during operation.

Controlling a temperature of the chip 310 as described in the present disclosure is in contrast to current chip cooling configurations that remove as much heat as possible. For example, current chip cooling devices such as cooling fans, finned heat sinks, heat pipes, etc. provide cooling at a surface of the chip, however, the cooling effect is not sufficient to maintain a chip in a narrow range at a selected temperature. As noted above in background discussion, current chip cooling configurations operate within ranges such as −20 to 80 degrees C. One embodiment of the invention includes operating the chip within a range of +/−20 degrees C. around a selected set temperature. In another embodiment, the chip is operated within a range of +/−10 degrees C. around a selected set temperature. Selected cooling configurations described above such as gas, boiling liquid, etc. are used to control the chip temperature within these ranges.

Controlling the chip temperature within a range such as +/−20 degrees C. or narrower has a number of advantages. With a narrow temperature range, the resulting material properties also exhibit much less variation. When the extreme temperature conditions are eliminated, there is no need to provide acceptable operation under these extreme operating conditions. This allows circuit and device designers an opportunity to design more efficient structures. Some properties that exhibit less variation when temperature ranges are controlled include electromigration, conductivity, operating speed, and reliability.

Figure 4:
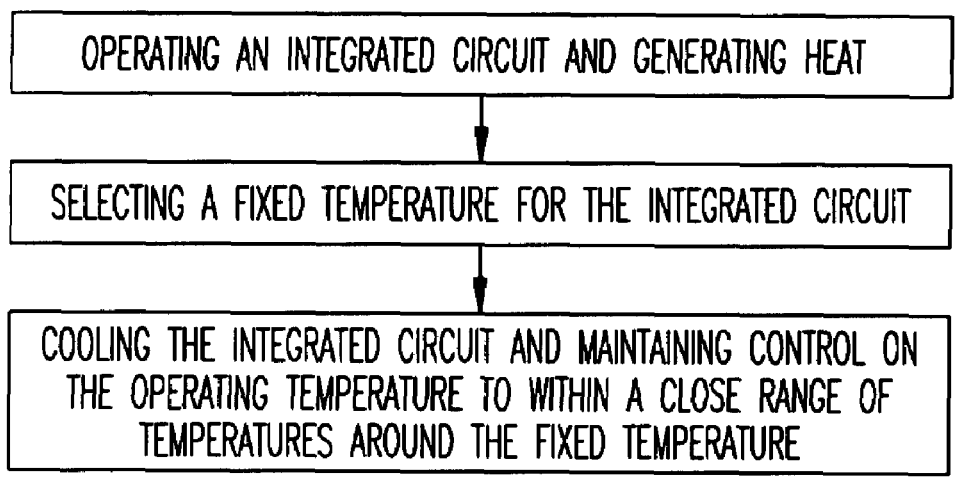
FIG. 4 shows a flow diagram according to an embodiment of the invention.

Although a number of specific cooling configurations are described in embodiments above, the concept of controlling a chip temperature is not so limited to individual devices. For example, mechanical refrigeration or Peltier effect devices can be used by themselves for low heat generating systems without gas cooling or boiling liquid. FIG. 4 shows an example flow diagram where heat is generated in an integrated circuit. An appropriate temperature is selected for operation of the integrated circuit in association with a cooling system that is capable of delivering that temperature and maintaining it during operation of the circuit. The circuit is then cooled and maintained within a range about the selected temperature, thus allowing designers to build more efficient structures with the more narrow operating temperature range in mind.

Figure 5:
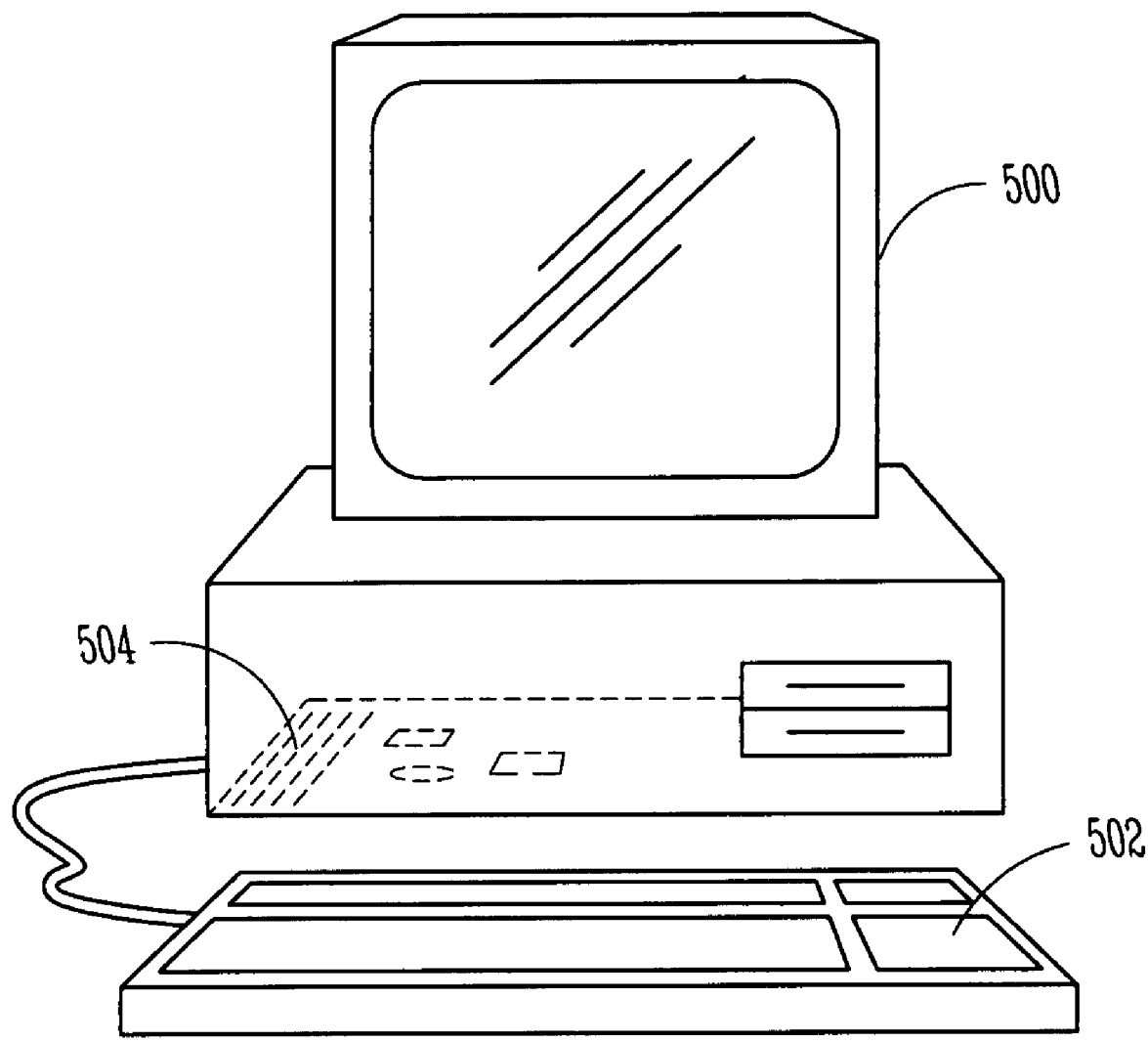
FIG. 5 shows an information handling system according to an embodiment of the invention.
Figure 6:
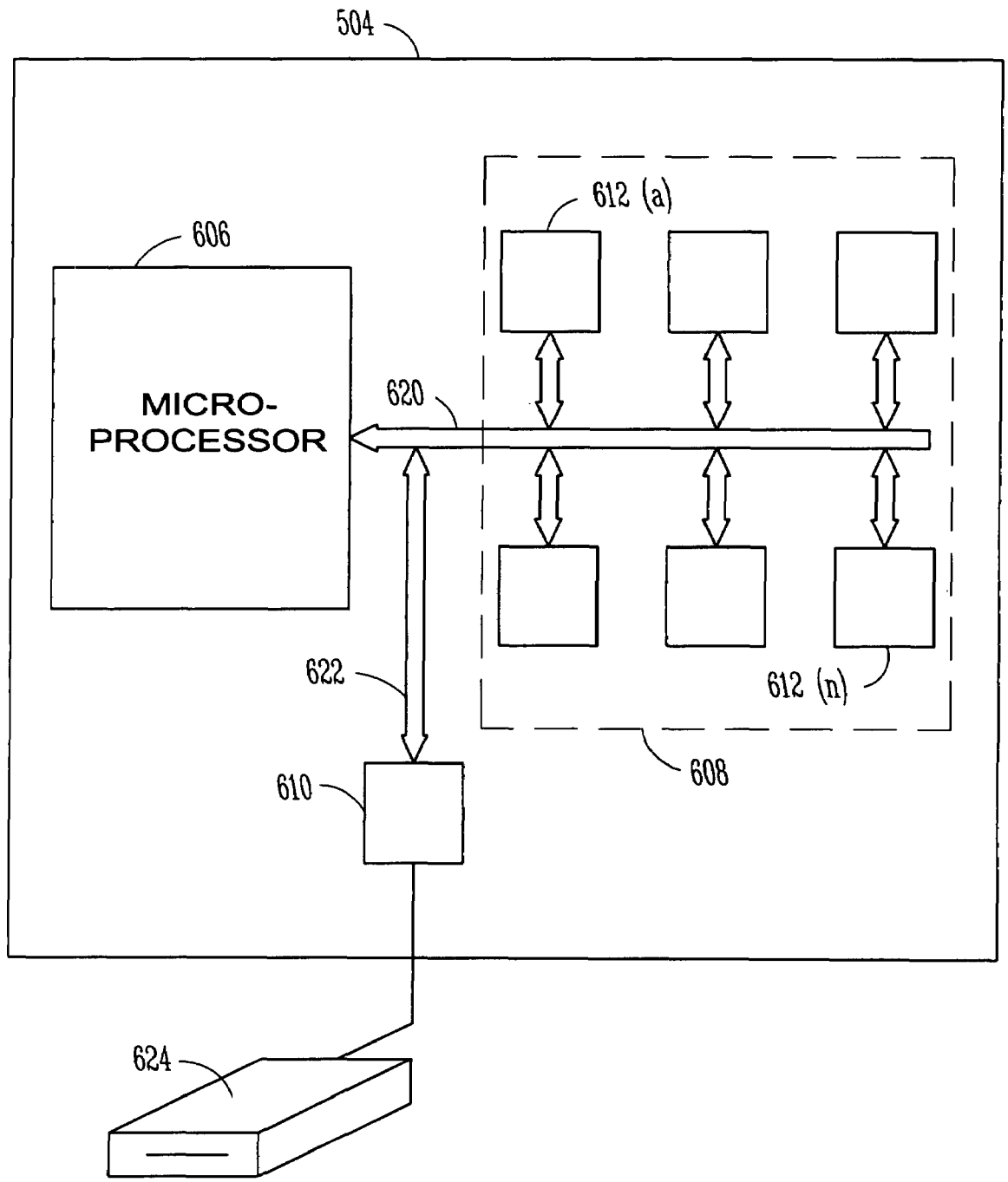
FIG. 6 shows a block diagram of a processing unit according to an embodiment of the invention.
Figure 7:
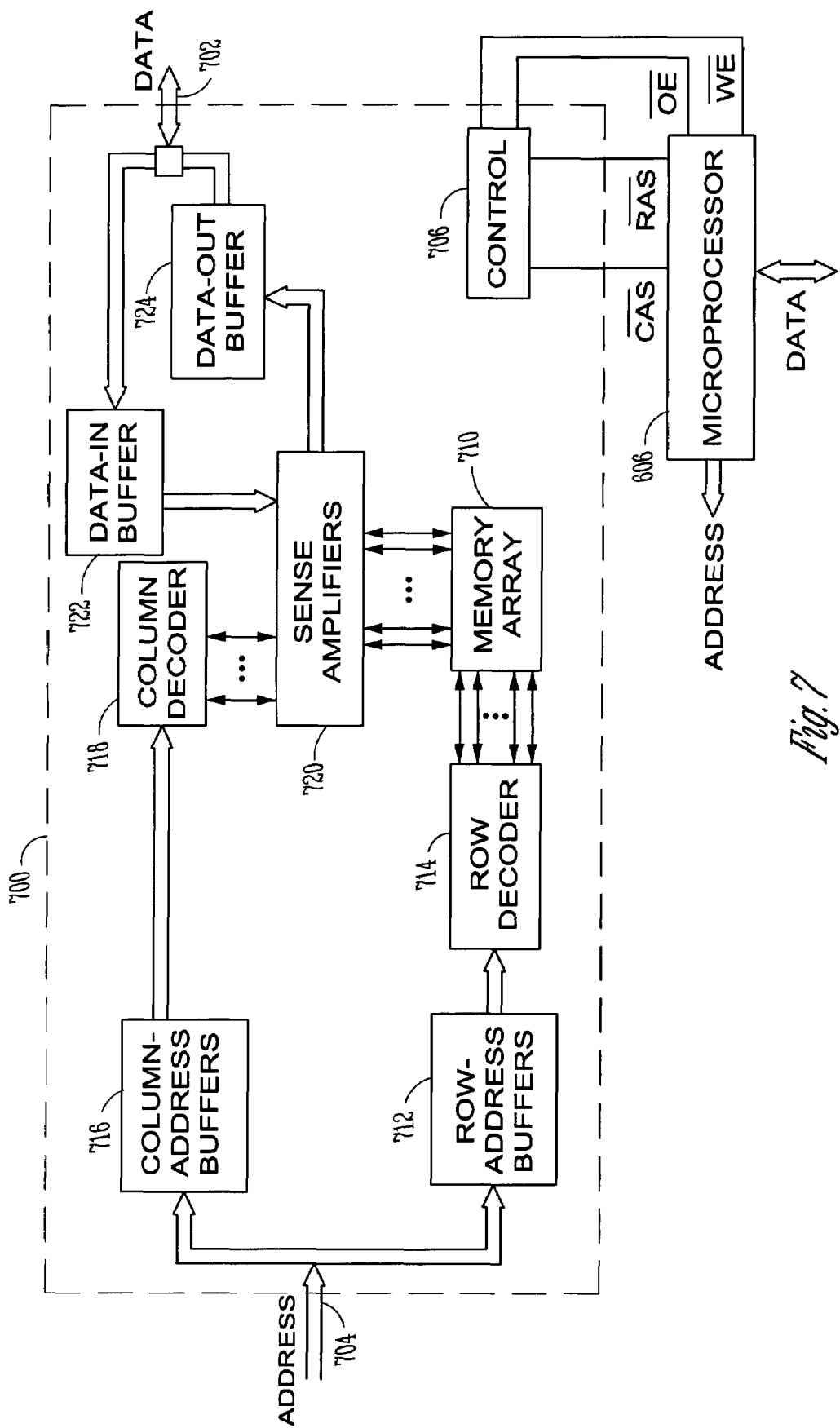
FIG. 7 shows a block diagram of a memory device according to an embodiment of the invention.

Semiconducting wafers, semiconductor devices, and IC's including cooling methods and systems described above may be implemented into memory devices and information handling devices as shown in FIG. 5, FIG. 6, and FIG. 7 and as described below. Chips such as memory chips, processor chips, and other integrated circuits can be cooled using methods and devices described above.

Another example use includes a complete system-on-a-chip (SOC). SOC solutions are being designed and made available for a variety of new applications viz. hand-held devices and wireless and broadband networking systems. These include on one end mobile applications such as cellular phones, PDAs, digital cameras etc; and at the other end, network and internet infrastructure applications such as Routers, Switches, Hubs etc. These chips integrate complex analog, RF, logic and memory functions and require steady levels of high performance with minimum power dissipation. Within a chip, different functions operate at different energy levels and therefore, creates different rate of heat dissipation and thermal gradient. To address such challenge, constant design compromises are being made in e.g. analog parametrics and in e.g. logic performance to control heat and power dissipation to meet performance and reliability objectives. Such devices will greatly improve performance and reliability if integrated with a cooling system as described in the present disclosure.

Further, in one embodiment, multiple cooling systems and methods are selected to cool individual circuits or chips to their respective individual needs. For example, a processor chip may need to be held at a higher constant temperature than a memory chip due to differences in the heat that each chip produces during operation. Conversely it may be desirable to maintain both segments of the system at the same temperature, with the differing heat loads dictating the use of different cooling mechanisms. While specific types of memory devices and computing devices are shown below, it will be recognized by one skilled in the art that several types of memory devices and information handling devices could utilize the invention.

A personal computer, as shown in FIGS. 5 and 6, includes a monitor 500, keyboard input 502 and a central processing unit 504. The processor unit typically includes microprocessor 606, memory bus circuit 608 having a plurality of memory slots 612(*a-n*), and other peripheral circuitry 610. Peripheral circuitry 610 permits various peripheral devices 624 to interface processor-memory bus 620 over input/output (I/O) bus 622. The personal computer shown in FIGS. 5 and 6 also includes at least one transistor having a gate oxide according to the teachings of the present invention.

Microprocessor 606 produces control and address signals to control the exchange of data between memory bus circuit 608 and microprocessor 606 and between memory bus circuit 608 and peripheral circuitry 610. This exchange of data is accomplished over high speed memory bus 620 and over high speed I/O bus 622.

Coupled to memory bus 620 are a plurality of memory slots 612(*a-n*) which receive memory devices well known to those skilled in the art. For example, single in-line memory modules (SIMMs) and dual in-line memory modules (DIMMs) may be used in the implementation of the present invention.

These memory devices can be produced in a variety of designs which provide different methods of reading from and writing to the dynamic memory cells of memory slots 612. One such method is the page mode operation. An alternate type of device is the extended data output (EDO) memory. Other alternative types of devices include SDRAM, DDR SDRAM, SLDRAM and Direct RDRAM as well as others such as SRAM or Flash memories.

FIG. 7 is a block diagram of an illustrative DRAM device 700 compatible with memory slots 612(*a-n*). The description of DRAM 700 has been simplified for purposes of illustrating a DRAM memory device and is not intended to be a complete description of all the features of a DRAM. Those skilled in the art will recognize that a wide variety of memory devices may be used in the implementation of the present invention. The example of a DRAM memory device shown in FIG. 7 includes at least one transistor having a gate oxide according to the teachings of the present invention.

Control, address and data information provided over memory bus 620 is further represented by individual inputs to DRAM 700, as shown in FIG. 7. These individual representations are illustrated by data lines 702, address lines 704 and various discrete lines directed to control logic 706.

As is well known in the art, DRAM 700 includes memory array 710 which in turn comprises rows and columns of addressable memory cells. Each memory cell in a row is coupled to a common wordline. Additionally, each memory cell in a column is coupled to a common bitline. Each cell in memory array 710 includes a storage capacitor and an access transistor as is conventional in the art.

DRAM 700 interfaces with, for example, microprocessor 606 through address lines 704 and data lines 702. Alternatively, DRAM 700 may interface with a DRAM controller, a micro-controller, a chip set or other electronic system. Microprocessor 606 also provides a number of control signals to DRAM 700, including but not limited to, row and column address strobe signals RAS and CAS, write enable signal WE, an output enable signal OE and other conventional control signals.

Row address buffer 712 and row decoder 714 receive and decode row addresses from row address signals provided on address lines 704 by microprocessor 606. Each unique row address corresponds to a row of cells in memory array 710. Row decoder 714 includes a wordline driver, an address decoder tree, and circuitry which translates a given row address received from row address buffers 712 and selectively activates the appropriate wordline of memory array 710 via the wordline drivers.

Column address buffer 716 and column decoder 718 receive and decode column address signals provided on address lines 704. Column decoder 718 also determines when a column is defective and the address of a replacement column. Column decoder 718 is coupled to sense amplifiers 720. Sense amplifiers 720 are coupled to complementary pairs of bitlines of memory array 710.

Sense amplifiers 720 are coupled to data-in buffer 722 and data-out buffer 724. Data-in buffers 722 and data-out buffers 724 are coupled to data lines 702. During a write operation, data lines 702 provide data to data-in buffer 722. Sense amplifier 720 receives data from data-in buffer 722 and stores the data in memory array 710 as a charge on a capacitor of a cell at an address specified on address lines 704.

During a read operation, DRAM 700 transfers data to microprocessor 606 from memory array 710. Complementary bitlines for the accessed cell are equilibrated during a precharge operation to a reference voltage provided by an equilibration circuit and a reference voltage supply. The charge stored in the accessed cell is then shared with the associated bitlines. A sense amplifier of sense amplifiers 720 detects and amplifies a difference in voltage between the complementary bitlines. The sense amplifier passes the amplified voltage to data-out buffer 724.

Control logic 706 is used to control the many available functions of DRAM 700. In addition, various control circuits and signals not detailed herein initiate and synchronize DRAM 700 operation as known to those skilled in the art. As stated above, the description of DRAM 700 has been simplified for purposes of illustrating the present invention and is not intended to be a complete description of all the features of a DRAM.

Those skilled in the art will recognize that a wide variety of memory devices, including but not limited to, SDRAMs, SLDRAMs, RDRAMs and other DRAMs and SRAMs, VRAMs and EEPROMs, may be used in the implementation of the present invention. The DRAM implementation described herein is illustrative only and not intended to be exclusive or limiting.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. An integrated circuit, comprising:
   a number of electronic devices connected by chip level metal interconnection structures;
   a gaseous heat conducting media located in direct contact with at least a portion of the chip level metal interconnection structures;
   a cooling system to cool the gaseous heat conducting media and conduct heat away from the chip level metal interconnection structures; and
   a temperature sensing circuit that uses the cooling system to control a temperature of the integrated circuit in a range about a chosen constant temperature.

2. The integrated circuit of claim 1, wherein the gaseous heat conducting media includes a mixture of hydrogen and helium.

3. The integrated circuit of claim 2, wherein the gaseous heat conducting media is pressurized in a range of approximately 5 to 50 MPa.

4. The integrated circuit of claim 1, wherein the range is approximately plus or minus 20 degrees Centigrade.

5. The integrated circuit of claim 1, wherein the range is approximately plus or minus 10 degrees Centigrade.

6. A memory device, comprising:
   a number of memory cells;
   a number of metal interconnection structures coupled to the memory cells, wherein the metal interconnection structures are suspended without contact to other structures over at least a portion of their length;
   a gaseous heat conducting media located in direct contact with at least a portion of the metal interconnection structures;
   a cooling system to cool the gaseous heat conducting media and conduct heat away from the metal interconnection structures; and
   a temperature sensing circuit that uses the cooling system to control a temperature of the memory device in a range about a chosen constant temperature.

7. The memory device of claim 6, wherein the gaseous heat conducting media includes a mixture of hydrogen and helium.

8. The memory device of claim 6, wherein the metal interconnection structures include aluminum interconnection structures.

9. The memory device of claim 6, wherein the metal interconnection structures include copper interconnection structures.

10. The memory device of claim 6, wherein the cooling system includes a mechanical refrigeration device.

11. The memory device of claim 6, wherein the cooling system includes a Peltier effect device.

12. A memory device, comprising:

a number of memory cells;

a number of metal interconnection structures coupled to the memory cells, wherein the metal interconnection structures are suspended without contact to other structures over at least a portion of their length;

a gas mixture of helium and hydrogen in direct contact with at least a portion of the metal interconnection structures;

a cooling system to cool the gas mixture and conduct heat away from the metal interconnection structures.

13. The memory device of claim 12, wherein the gas mixture is pressurized in a range of approximately 5 to 50 MPa.

14. The memory device of claim 12, further including a temperature sensing circuit that uses the cooling system to control a temperature of the memory device in a range about a chosen constant temperature.

15. The memory device of claim 14, wherein the range is approximately plus or minus 20 degrees Centigrade.

16. The memory device of claim 14, wherein the range is approximately plus or minus 10 degrees Centigrade.

17. An integrated circuit, comprising:

a number of electronic devices connected by metal interconnection structures, wherein the metal interconnection structures are suspended without contact to other structures over at least a portion of their length;

a gaseous heat conducting media located in direct contact with at least a portion of the metal interconnection structures; and a cooling and heat controlling means to control a temperature of the integrated circuit in a range about a chosen constant temperature.

18. The integrated circuit of claim 17, wherein the cooling and heat controlling means includes a mechanical refrigeration device.

19. The integrated circuit of claim 17, wherein the cooling and heat controlling means includes a Peltier effect device.

* * * * *